United States Patent
Guo et al.

(10) Patent No.: US 12,218,220 B2
(45) Date of Patent: Feb. 4, 2025

(54) MANUFACTURING METHOD OF SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Shuai Guo, Hefei (CN); Mingguang Zuo, Hefei (CN); Shijie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 468 days.

(21) Appl. No.: 17/661,359

(22) Filed: Apr. 29, 2022

(65) Prior Publication Data
US 2023/0231036 A1  Jul. 20, 2023

Related U.S. Application Data

(63) Continuation of application No. PCT/CN2022/078671, filed on Mar. 1, 2022.

(30) Foreign Application Priority Data

Jan. 17, 2022  (CN) .......................... 202210049426.0

(51) Int. Cl.
H01L 21/8234 (2006.01)
H01L 29/66 (2006.01)
H01L 29/786 (2006.01)

(52) U.S. Cl.
CPC ............ H01L 29/66742 (2013.01); H01L 21/823412 (2013.01); H01L 21/823481 (2013.01); H01L 29/78696 (2013.01)

(58) Field of Classification Search
CPC ............. H10B 12/00–50; H10B 69/00; H10B 41/00–70; H10B 43/00–50;
(Continued)

(56) References Cited

U.S. PATENT DOCUMENTS 8,203,866 B2  6/2012  Gonzalez et al.
9,911,748 B2  3/2018  Nishikawa et al.
(Continued)

FOREIGN PATENT DOCUMENTS

CN  101641788 B  8/2012
CN  105261617 A  1/2016
(Continued)

OTHER PUBLICATIONS

International Search Report cited in PCT/CN2022/078671 mailed Aug. 29, 2022, 8 pages.

*Primary Examiner* — Eric A. Ward
*Assistant Examiner* — Nora T. Nix
(74) *Attorney, Agent, or Firm* — Syncoda LLC; Feng Ma

(57) ABSTRACT

The present disclosure provides a semiconductor structure and a manufacturing method thereof. The manufacturing method includes: depositing a thin-film stacked structure on a substrate; forming a first hole in the thin-film stacked structure; growing an epitaxial silicon pillar in the first hole; etching the thin-film stacked structure and the epitaxial silicon pillar along a first direction to form a first trench, the first trench passing through a center of the epitaxial silicon pillar and dividing the epitaxial silicon pillar into a first half pillar and a second half pillar; forming a first isolation layer; forming a first channel region of a first doping type, and forming a second channel region of a second doping type; and forming a gate dielectric layer and a gate conductive layer on a surface of each of the first channel region and the second channel region.

17 Claims, 17 Drawing Sheets

(58) Field of Classification Search
CPC ... H10B 12/20; H01L 2924/1436–14369; H01L 28/40–92; H01L 2924/1451; H01L 29/78642; H01L 29/66666; G11C 11/401–4099; G11C 14/0009–0045; G11C 2211/4016; G11C 16/02; G11C 16/0408–0458; G11C 16/0483; G11C 11/5621–5642; G11C 2216/06–10; G11C 16/0466–0475; G11C 27/005; G11C 11/5671

See application file for complete search history.

(56) References Cited

U.S. PATENT DOCUMENTS

| | | | |
|---|---|---|---|
| 10,644,020 | B2 | 5/2020 | Huo et al. |
| 2002/0163027 | A1* | 11/2002 | Skotnicki ......... H01L 29/66666 257/302 |
| 2016/0329101 | A1 | 11/2016 | Sakakibara |
| 2022/0085070 | A1 | 3/2022 | Yin et al. |

FOREIGN PATENT DOCUMENTS

| | | |
|---|---|---|
| CN | 107996000 A | 5/2018 |
| CN | 110047844 A | 7/2019 |
| CN | 113725226 A | 11/2021 |
| WO | 2020163007 A1 | 8/2020 |

* cited by examiner

MANUFACTURING METHOD OF SEMICONDUCTOR STRUCTURE AND SEMICONDUCTOR STRUCTURE

CROSS-REFERENCE TO RELATED APPLICATIONS

The present disclosure is a national stage of International Patent Application No. PCT/CN2022/078671, filed on Mar. 1, 2022, which claims the priority of Chinese Patent Application No. 202210049426.0, titled "MANUFACTURING METHOD OF SEMICONDUCTOR STRUCTURE AND SEMICONDUCTOR STRUCTURE" and filed on Jan. 17, 2022. The entire contents of International Patent Application No. PCT/CN2022/078671 and Chinese Patent Application No. 202210049426.0 are incorporated by reference herein.

TECHNICAL FIELD

The present disclosure relates to the technical field of semiconductors, and in particular to a manufacturing method of a semiconductor structure and a semiconductor structure.

BACKGROUND

With the development of semiconductor industry, how to realize a higher memory density for benefit maximization has become an important subject for many semiconductor researchers and practitioners. At present, memory cells in conventional random access memory (DRAM) adopt a one-transistor one-capacitor (1T1C) structure, namely one transistor corresponding to one capacitor structure. In response to the ever-increasing demand of memory capacities and the miniaturization of process dimensions, severe challenges have been presented to processes of the memory cells using capacitor structures.

SUMMARY

An aspect of the present disclosure provides a manufacturing method of a semiconductor structure, including: providing a substrate, and depositing a thin-film stacked structure on the substrate; forming a first hole in the thin-film stacked structure, the first hole extending through the thin-film stacked structure along a stacking direction of the thin-film stacked structure, and a bottom of the first hole exposing the substrate; growing an epitaxial silicon pillar in the first hole; etching the thin-film stacked structure and the epitaxial silicon pillar along a first direction to form a first trench, the first trench passing through a center of the epitaxial silicon pillar and dividing the epitaxial silicon pillar into a first half pillar and a second half pillar; forming a first isolation layer, the first isolation layer filling the first trench; forming a first channel region of a first doping type in a sidewall of the first half pillar away from the first trench, and forming a second channel region of a second doping type in a sidewall of the second half pillar away from the first trench, one of the first doping type and the second doping type being an N type, and the other one being a P type; and forming a gate dielectric layer and a gate conductive layer on a surface of each of the first channel region and the second channel region.

Another aspect of the present disclosure provides a semiconductor structure, including a substrate, a thin-film stacked structure, an epitaxial silicon pillar and a first isolation layer, where the thin-film stacked structure is provided on a surface of the substrate; a first hole exposing the substrate is formed in the thin-film stacked structure; the epitaxial silicon pillar is provided in the first hole; the first isolation layer is provided in the first trench; the first trench is formed by removing a part of the thin-film stacked structure and a part of the epitaxial silicon pillar along a first direction; the first trench passes through a center of the epitaxial silicon pillar and divides the epitaxial silicon pillar into a first half pillar and a second half pillar; a first channel region of a first doping type is formed in a sidewall of the first half pillar away from the first trench; a second channel region of a second doping type is formed in a sidewall of the second half pillar away from the first trench; one of the first doping type and the second doping type is an N type, and the other one is a P type; and a gate dielectric layer and a gate conductive layer are arranged on a surface of each of the first channel region and the second channel region.

DETAILED DESCRIPTION

Figure 1:
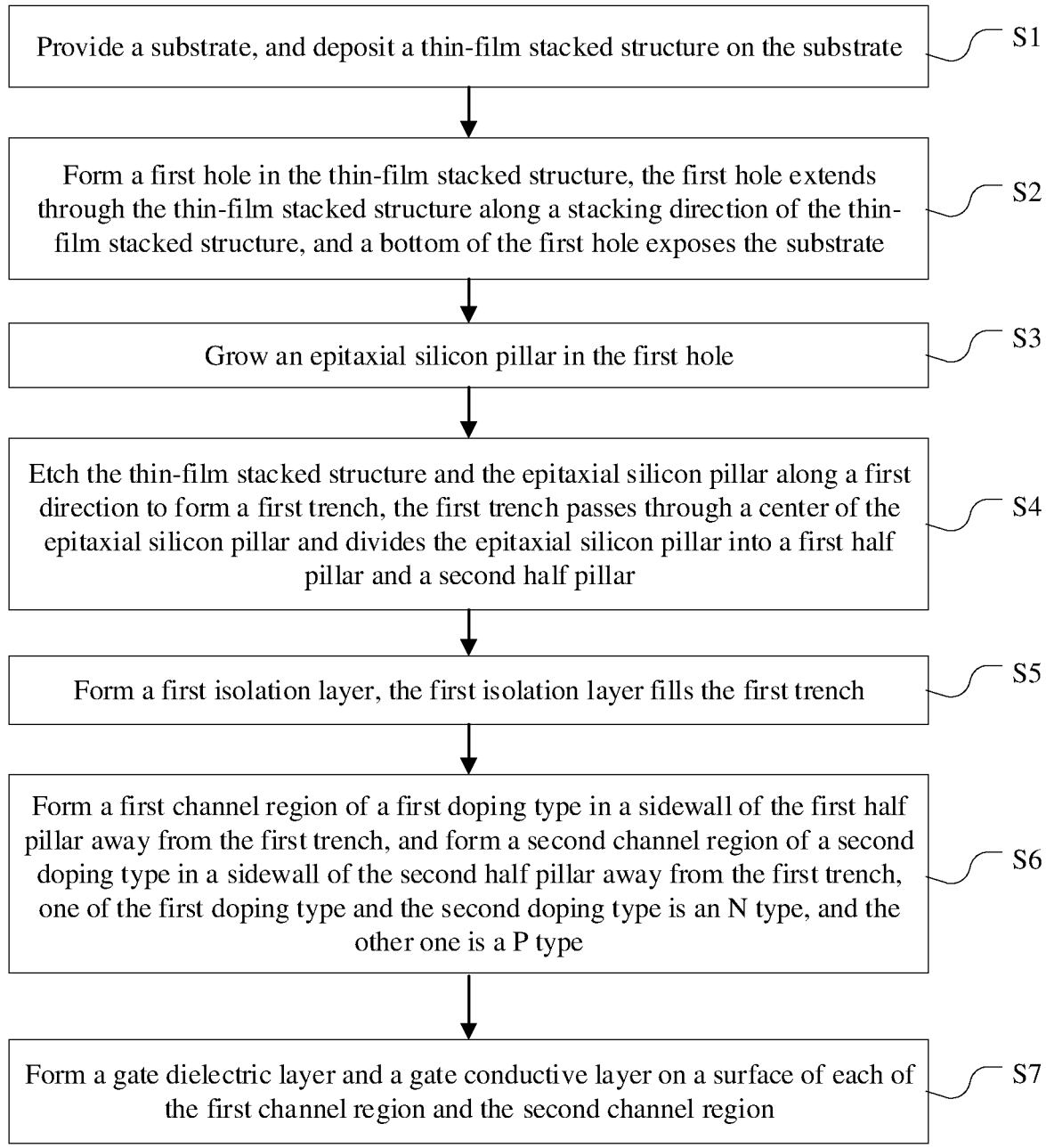
FIG. 1 is a flowchart of a manufacturing method of a semiconductor structure according to an exemplary implementation.

Exemplary embodiments will be described below comprehensively with reference to the drawings. The exemplary embodiments may be implemented in various forms, and may not be construed as being limited to those described herein. On the contrary, these exemplary embodiments are provided to make the present disclosure comprehensive and complete and to fully convey the concept manifested therein to those skilled in the art. The same reference numerals in the figures indicate the same or similar structures, and thus their detailed descriptions will be omitted.

FIG. 1 representatively illustrates a flowchart of a manufacturing method of a semiconductor structure according to the present disclosure. In the exemplary implementation, the manufacturing method of a semiconductor structure according to the present disclosure is described by taking a three-dimensional (3D) NOP-type capacitor-less DRAM device as an example. It is understandable for those skilled in the art that, in order to apply the relevant design of the present disclosure to other types of semiconductor structures, various modifications, additions, substitutions, deletions or other changes may be made to the following specific implementations, but such changes are still within the scope of the principle of the manufacturing method of a semiconductor structure proposed by the present disclosure.

As shown in FIG. 1, in an implementation of the present disclosure, a manufacturing method of a semiconductor structure according to the present disclosure includes the following steps:

Step S1: Provide a substrate 100, and deposit a thin-film stacked structure 200 on the substrate 100.

Step S2: Form a first hole V1 in the thin-film stacked structure 200, the first hole V1 extending through the thin-film stacked structure 200 along a stacking direction of the thin-film stacked structure 200, and a bottom of the first hole V1 exposing the substrate 100.

Step S3: Grow an epitaxial silicon pillar 110 in the first hole V1.

Step S4: Etch the thin-film stacked structure 200 and the epitaxial silicon pillar 110 along a first direction X to form a first trench G1, the first trench G1 passing through a center of the epitaxial silicon pillar 110 and dividing the epitaxial silicon pillar 110 into a first half pillar 111 and a second half pillar 112.

Step S5: Form a first isolation layer 300, the first isolation layer 300 filling the first trench G1.

Step S6: Form a first channel region A of a first doping type in a sidewall of the first half pillar 111 away from the first trench G1, and form a second channel region B of a second doping type in a sidewall of the second half pillar 112 away from the first trench G1, one of the first doping type and the second doping type being an N type, and the other one being a P type.

Step S7: Form a gate dielectric layer and a gate conductive layer 430 on a surface of each of the first channel region A and the second channel region B.

With the above design, the manufacturing method of a semiconductor structure according to the present disclosure can specifically manufacture the 3D NOP capacitor-less DRAM device. Because of no capacitor structure in the semiconductor structure manufactured with the method, the process is simpler and easier to realize a higher memory density, which fills the technical gap of the 3D NOP capacitor-less DRAM device in the industry.

Figure 2:
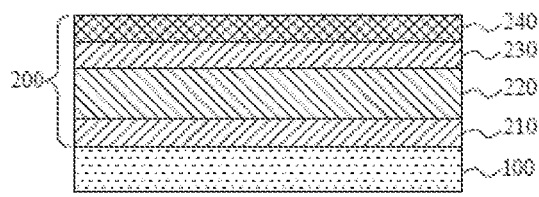
FIGS. 2-63 are stacked structures of a semiconductor structure from different perspectives in various steps in the manufacturing method of a semiconductor structure in FIG. 1.
Figure 62:
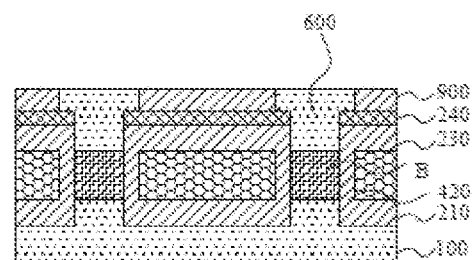
Figure 63:
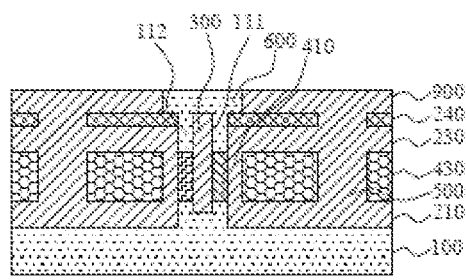

FIGS. 2-63 representatively illustrate stacked structures of a semiconductor structure from different perspectives in various steps in the manufacturing method of a semiconductor structure in FIG. 1. Specifically, FIG. 2, FIG. 4, FIG. 6, . . . , FIG. 62 representatively illustrate sectional views of a semiconductor structure in various steps along a first direction X, and FIG. 3, FIG. 5, FIG. 7, . . . , FIG. 63 representatively illustrate sectional views of a semiconductor structure in various steps along a second direction Y. The first direction X is not parallel to the second direction Y. The specific processes, materials, sequences and so on in main steps in the manufacturing method of a semiconductor structure according to the present disclosure will be described below in detail in conjunction with the accompanying drawings.

Figure 4:
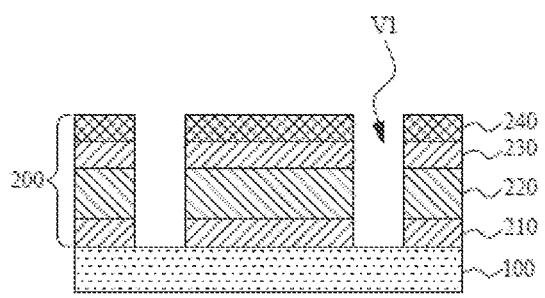
Figure 5:
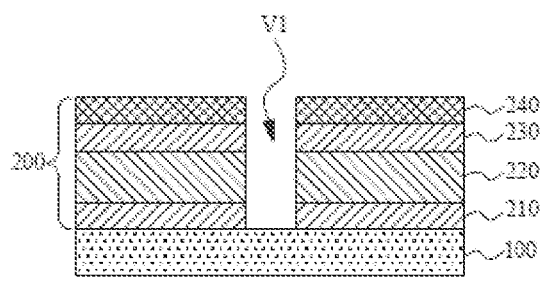

As shown in FIG. 4 and FIG. 5, in an implementation of the present disclosure, "forming a first hole V1 in the thin-film stacked structure 200" in Step S2 may specifically include: Form, on the thin-film stacked structure 200, a patterned mask layer 800 (not shown in the figures) with a hole pattern, and etch the thin-film stacked structure 200 along the hole pattern until the substrate 100 is exposed, thereby forming the first hole V1.

Figure 6:
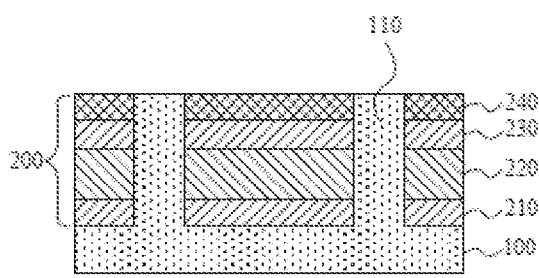
Figure 7:
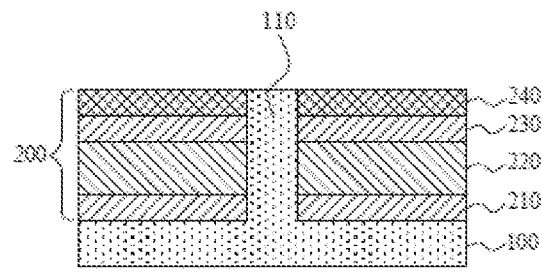

As shown in FIG. 6 and FIG. 7, in an implementation of the present disclosure, "growing an epitaxial silicon pillar 110 in the first hole V1" in Step S3 may specifically include: Grow, in the first hole V1, the epitaxial silicon pillar 110 with a selective epitaxial growth method from a surface of the substrate 100 exposed by the first hole V1, until a top surface of the epitaxial silicon pillar 110 is not lower than a top surface of the patterned mask layer 800.

Figure 9:
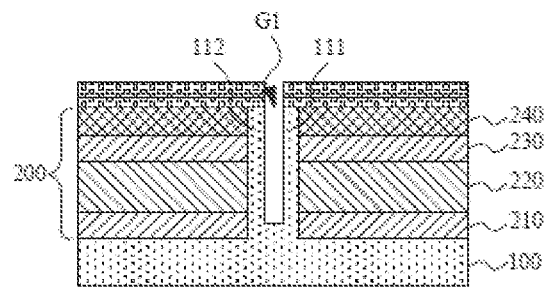

As shown in FIG. 9, in an implementation of the present disclosure, a width of the first trench G1 in the second direction Y is 30-90% of a maximum width of the epitaxial silicon pillar 110 in the second direction Y, such as 30%, 45%, 65% and 90%. In some implementations, the width of the first trench G1 in the second direction Y may also be less than 30% or greater than 90% of the maximum width of the epitaxial silicon pillar 110 in the second direction Y, such as 28% and 91%, but is not limited thereto.

As shown in FIG. 1 and FIG. 2, in an implementation of the present disclosure, "depositing a thin-film stacked structure 200 on the substrate 100" in Step S1 may specifically include: Sequentially deposit a first insulating layer 210, a sacrificial layer 220, a second insulating layer 230 and a mask covering layer 240 on the substrate 100, a thickness of the sacrificial layer 220 being 50-90% of a thickness of the thin-film stacked structure 200, such as 50%, 60%, 75% and 90%. In some implementations, the thickness of the sacrificial layer 220 may also be less than 50% or greater than 90% of the thickness of the thin-film stacked structure 200, such as 48% and 91%, but is not limited thereto.

Figure 14:
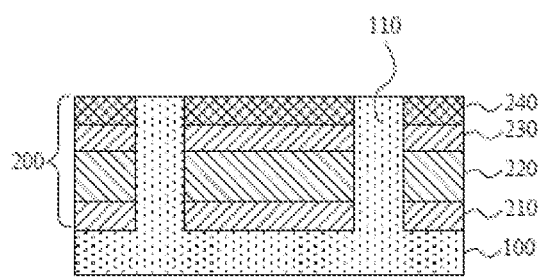
Figure 15:
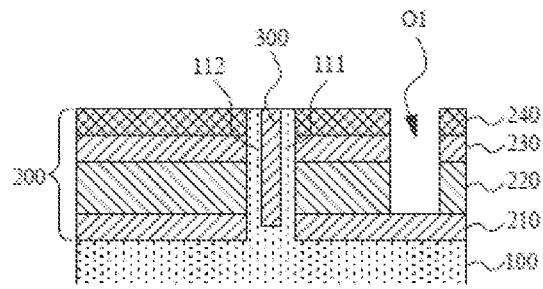

As shown in FIG. 14 and FIG. 15, in an implementation of the present disclosure, after "forming a first isolation layer 300", Step S6 may further include: Form a first opening O1 in the thin-film stacked structure 200 at a first side of the first isolation layer 300, the first opening O1 exposing at least a part of the sacrificial layer 220.

Figure 16:
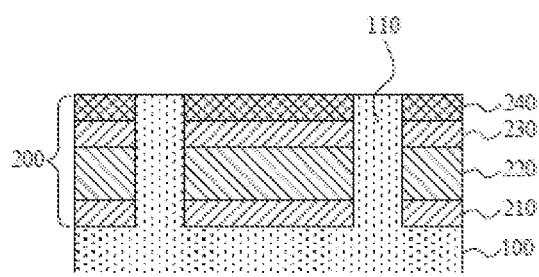
Figure 17:
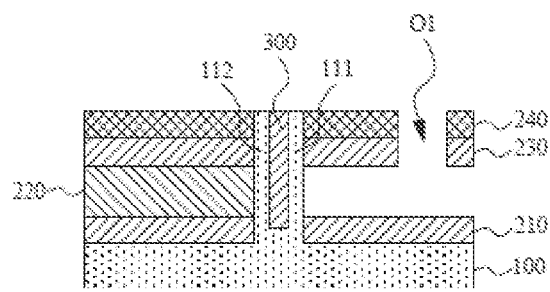

As shown in FIG. 16 and FIG. 17, in an implementation of the present disclosure, after "forming a first opening O1", Step S6 may further include: Remove, with wet etching along the first opening O1, the sacrificial layer 220 at a side of the first isolation layer 300 close to the first opening O1, to expose the sidewall of the first half pillar 111 away from the first trench G1.

As shown in FIG. 18 to FIG. 21, in an implementation of the present disclosure, "forming a first channel region A of a first doping type in a sidewall of the first half pillar 111 away from the first trench G1" in Step S6 may specifically include: Selectively remove, after "exposing the sidewall of the first half pillar 111 away from the first trench G1", a part of the first half pillar 111 with wet etching to form a first gap O2 in the sidewall of the first half pillar 111 away from the first trench G1, and form the first channel region A of the first doping type at the first gap O2 with a selective epitaxial growth method and an in-situ doping method.

Figure 22:
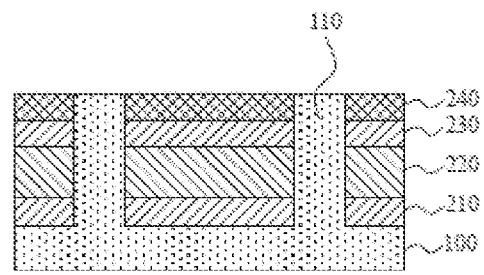
Figure 23:
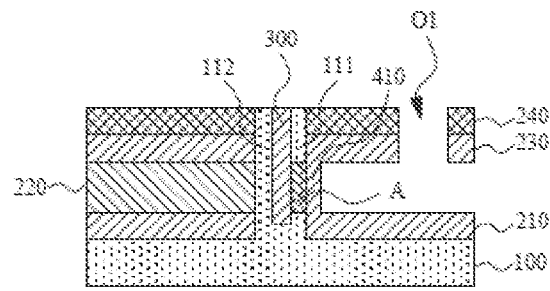

As shown in FIG. 22 and FIG. 23, in an implementation of the present disclosure, the gate dielectric layer in Step S7 may include a first gate dielectric layer 410 and a second gate dielectric layer 420. "Forming a gate dielectric layer in each of the first channel region A and the second channel region B" may specifically include: Form the first gate dielectric layer 410 on a sidewall of the first channel region A to cover the surface of the first channel region A.

Figure 24:
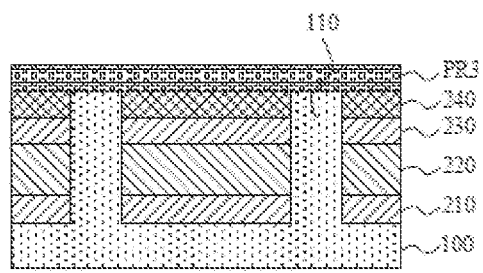
Figure 25:
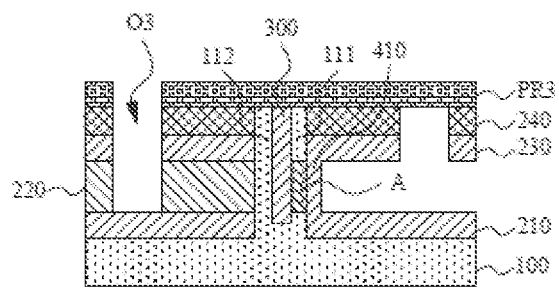

As shown in FIG. 24 and FIG. 25, in an implementation of the present disclosure, after "forming the first gate dielectric layer 410 on a sidewall of the first channel region A to cover the surface of the first channel region A", Step S6 may further include: Form a second opening O3 in the thin-film stacked structure 200 at a second side of the first isolation layer 300, the third opening O3 exposing at least a part of the sacrificial layer 220.

Figure 26:
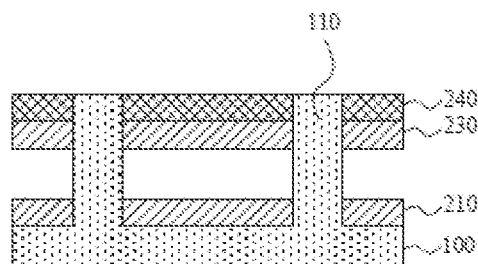
Figure 27:
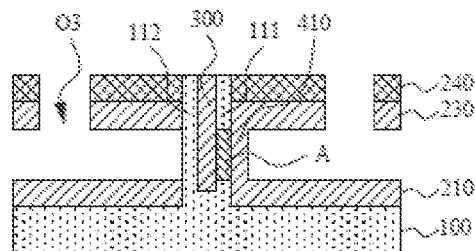

As shown in FIG. 26 and FIG. 27, in an implementation of the present disclosure, after "forming a second opening O3", Step S6 may further include: Remove, with wet etching along the second opening O3, the sacrificial layer 220 at a side of the first isolation layer 300 close to the second opening O3, to expose the sidewall of the second half pillar 112 away from the first trench G1.

As shown in FIG. 28 to FIG. 31, in an implementation of the present disclosure, "forming a second channel region B of a second doping type in a sidewall of the second half pillar 112 away from the first trench G1" in Step S6 may specifically include: Selectively remove, after "exposing the sidewall of the second half pillar 112 away from the first trench G1", a part of the second half pillar 112 with wet etching to form a second gap O4 in the sidewall of the second half pillar 112 away from the first trench G1, and form the second channel region B of the second doping type at the second gap O4 with the selective epitaxial growth method and the in-situ doping method.

Figure 32:
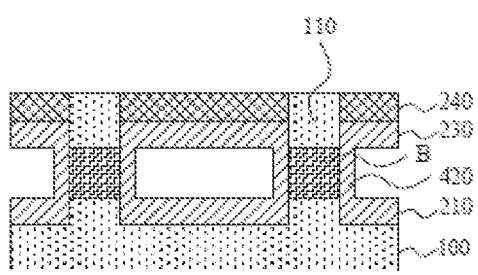
Figure 33:
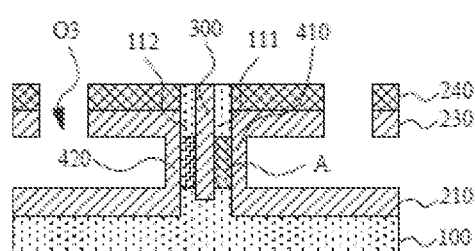

As shown in FIG. 32 and FIG. 33, in an implementation of the present disclosure, the gate dielectric layer in Step S7 may include the first gate dielectric layer 410 and the second gate dielectric layer 420. "Forming a gate dielectric layer in each of the first channel region A and the second channel region B" may specifically include: Form the second gate dielectric layer 420 on a sidewall of the second channel region B to cover the surface of the second channel region B.

Figure 34:
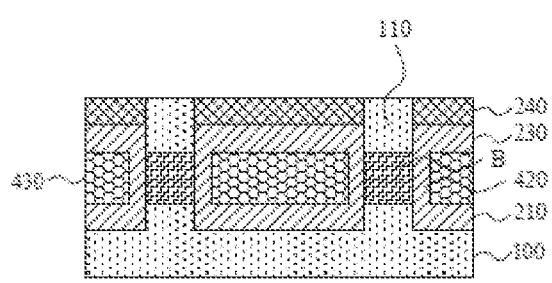
Figure 35:
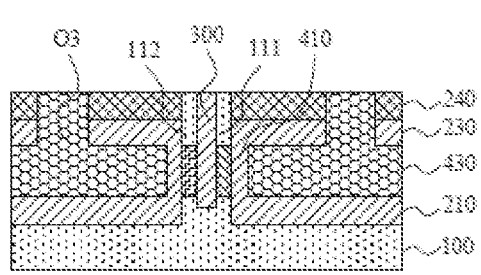

As shown in FIG. 34 and FIG. 35, in an implementation of the present disclosure, "forming a gate dielectric layer and a gate conductive layer 430 on a surface of each of the first channel region A and the second channel region B" in Step S7 may specifically include: Fill, after "forming the second gate dielectric layer 420 on a sidewall of the second channel region B to cover the surface of the second channel region B", the gate conductive layer 430 to positions where the sacrificial layer 220 is removed, along the first opening O1 and the second opening O3, wherein the gate conductive layer 430 covers the first gate dielectric layer 410 and the second gate dielectric layer 420.

In an implementation of the present disclosure, after Step S7, the manufacturing method of a semiconductor structure may further include the following step:

Form a second trench in a side of the first trench G1 close to the first opening O1, and form a third trench in a side of the first trench G1 close to the second opening O3, the second trench and the third trench being parallel to the first trench G1 and extending toward the first direction X, and a bottom of each of the second trench and the third trench exposing the first insulating layer 210 to separate the gate conductive layer 430; taking a part of the gate conductive layer 430 close to the first channel region A as a first gate electrode, and taking a part of the gate conductive layer 430 close to the second channel region B as a second gate electrode; filling a second isolation layer in the second trench, and filling a third isolation layer in the third trench.

Based on the above design, the following descriptions will be made to main steps in the manufacturing method of a semiconductor structure.

Figure 3:
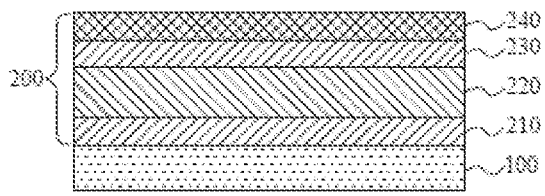

FIG. 2 and FIG. 3 representatively illustrate sectional views of a semiconductor structure from different perspectives in Step S1. In the step, the semiconductor structure includes a substrate 100 and a thin-film stacked structure 200. The thin-film stacked structure 200 includes a first insulating layer 210, a sacrificial layer 220, a second insulating layer 230 and a mask covering layer 240. The substrate 100 may be a silicon substrate. That is, a material of the substrate 100 includes silicon (Si). The first insulating layer 210 is deposited on a surface of the substrate 100. The sacrificial layer 220 is deposited on a surface of the first insulating layer 210. The second insulating layer 230 is deposited on a surface of the sacrificial layer 220. The mask covering layer 240 is deposited on a surface of the second insulating layer 230.

In an implementation of the present disclosure, a material of the first insulating layer 210 may include silicon oxide ($SiO_2$). In some implementations, the material of the first insulating layer 210 may also include other materials, such as other oxides, but is not limited thereto.

In an implementation of the present disclosure, a material of the second insulating layer 230 may include silicon oxide. In some implementations, the material of the second insulating layer 230 may also include other materials, such as other oxides, but is not limited thereto. In addition, the material of second insulating layer 230 may be the same as the material of the first insulating layer 210, but is not limited thereto.

In an implementation of the present disclosure, a material of the sacrificial layer 220 may include silicon nitride ($Si_3N_4$).

In an implementation of the present disclosure, a material of the mask covering layer 240 may include silicon oxynitride (SiON).

FIG. 4 and FIG. 5 representatively illustrate sectional views of a semiconductor structure from different perspectives in Step S2. In the step, the semiconductor structure includes a substrate 100 and a thin-film stacked structure 200. A first hole V1 is formed in the thin-film stacked structure 200. The first hole V1 extends from an upper surface of the thin-film stacked structure 200, namely an upper surface of the mask covering layer 240, to a lower surface of the thin-film stacked structure 200, namely a lower surface of the first insulating layer 210. In other words, the first hole V1 extends through the thin-film stacked structure 200 in a thickness direction. A part of an upper surface of the substrate 100 corresponding to the first hole V1 is exposed at a bottom of the first hole V1.

FIG. 6 and FIG. 7 representatively illustrate sectional views of a semiconductor structure from different perspectives in Step S3. In the step, the semiconductor structure includes a substrate 100, a thin-film stacked structure 200 and an epitaxial silicon pillar 110. The epitaxial silicon pillar 110 is grown from the upper surface of the substrate 100 exposed in the first hole V1, and fills the first hole V1. In addition, the growth height of the epitaxial silicon pillar 110 may be approximately the same as the depth of the first hole V1. That is, the upper surface of the epitaxial silicon pillar 110 may be approximately flush with a top aperture (namely the upper surface of the thin-film stacked structure 200, and also namely the upper surface of the mask covering layer 240) of the first hole V1. In some implementations, the growth height of the epitaxial silicon pillar 110 may also be slightly greater than the depth of the first hole V1. For example, the epitaxial silicon pillar extends out of the top aperture of the first hole V1, but is not limited thereto.

Figure 8:
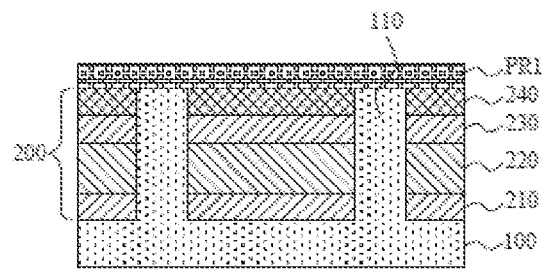

FIG. 8 and FIG. 9 representatively illustrate sectional views of a semiconductor structure from different perspectives in Step S4. In the step, the semiconductor structure includes a substrate 100, a thin-film stacked structure 200, an epitaxial silicon pillar 110 and a first photoresist layer PR1. The first photoresist layer PR1 is covered on the upper surface of the thin-film stacked structure 200 (namely the upper surface of the mask covering layer 240) and the upper surface of the epitaxial silicon pillar 110. The first photoresist layer PR1 is patterned to form a photoresist opening. A part of the epitaxial silicon pillar 110 not shielded by the first photoresist layer PR1 is etched and removed with the photoresist opening of the first photoresist layer PR1, such that a first trench G1 is formed in the epitaxial silicon pillar 110. The first trench G1 extends through a center of the epitaxial silicon pillar 110, and divides the epitaxial silicon pillar 110 into a first half pillar 111 and a second half pillar 112.

In addition, after Step S4, the remaining first photoresist layer PR1 is removed.

Figure 10:
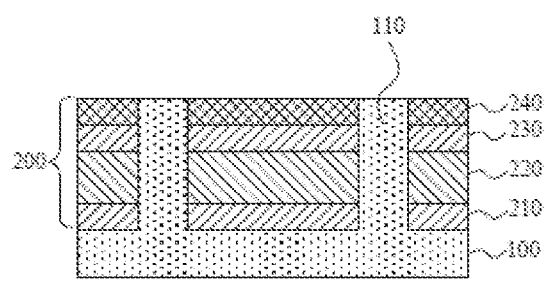
Figure 11:
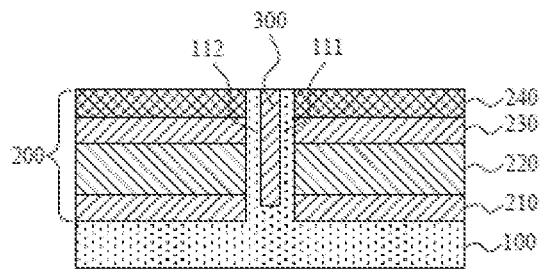

FIG. 10 and FIG. 11 representatively illustrate sectional views of a semiconductor structure from different perspectives in Step S5. In the step, the semiconductor structure includes a substrate 100, a thin-film stacked structure 200, a first half pillar 111, a second half pillar 112 and a first isolation layer 300. The first isolation layer 300 fills the first trench G1. In addition, the filling height of the first isolation layer 300 may be approximately the same as the depth of the first trench G1. That is, the upper surface of the first isolation layer 300 may be approximately flush with a top aperture (namely upper surfaces of the first half pillar 111 and the second half pillar, and also namely the upper surface of the thin-film stacked structure 200) of the first trench G1.

Figure 12:
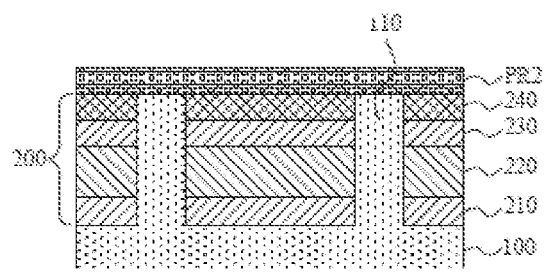
Figure 13:
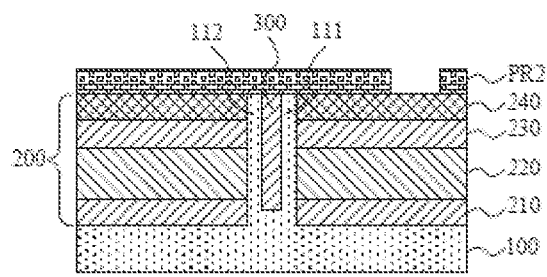

FIG. 12 and FIG. 13 representatively illustrate sectional views of a semiconductor structure from different perspectives in a sub-step of Step S6. In the sub-step, the semiconductor structure includes a substrate 100, a thin-film stacked structure 200, a first half pillar 111, a second half pillar 112, a first isolation layer 300 and a second photoresist layer PR2. The second photoresist layer PR2 is covered on the upper surface of the thin-film stacked structure 200 (namely the upper surface of the mask covering layer 240), the upper surfaces of the first half pillar 111 and the second half pillar 112, and the upper surface of the first isolation layer 300. The second photoresist layer PR2 is patterned to form a photoresist opening.

FIG. 14 and FIG. 15 representatively illustrate sectional views of a semiconductor structure from different perspectives in a sub-step of Step S6. In the sub-step, the semiconductor structure includes a substrate 100, a thin-film stacked structure 200, a first half pillar 111, a second half pillar 112 and a first isolation layer 300. In the sub-step, a part of the thin-film stacked structure 200 not shielded by the second photoresist layer PR2 is etched and removed with the photoresist opening of the second photoresist layer PR2 until the upper surface of the first insulating layer 210 is exposed, thereby forming a first opening O1 in the thin-film stacked structure 200.

In addition, after the first opening O1 is formed, the remaining second photoresist layer PR2 is removed.

FIG. 16 and FIG. 17 representatively illustrate sectional views of a semiconductor structure from different perspectives in a sub-step of Step S6. In the sub-step, the semiconductor structure includes a substrate 100, a thin-film stacked structure 200, a first half pillar 111, a second half pillar 112 and a first isolation layer 300. In the sub-step, the sacrificial layer 220 at a side of the first isolation layer 300 close to the first opening O1 is removed along the first opening O1, to expose the sidewall of the first half pillar 111 away from the first trench G1.

In an implementation of the present disclosure, in the sub-step, the part of the sacrificial layer 220 may be specifically removed with wet etching.

Figure 18:
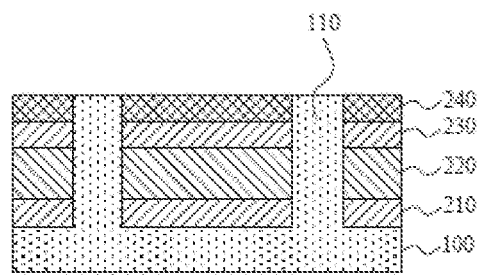
Figure 19:
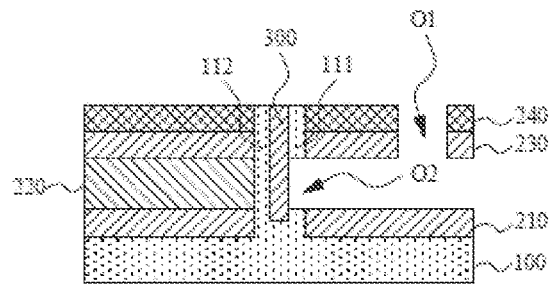

FIG. 18 and FIG. 19 representatively illustrate sectional views of a semiconductor structure from different perspectives in a sub-step of Step S6. In the sub-step, the semiconductor structure includes a substrate 100, a thin-film stacked structure 200, a first half pillar 111, a second half pillar 112 and a first isolation layer 300. In the sub-step, after the sidewall of the first half pillar 111 away from the first trench G1 is exposed, a part of the first half pillar 111 is selectively removed to form a first gap O2 in the sidewall of the first half pillar 111 away from the first trench G1.

In an implementation of the present disclosure, in the sub-step, the first half pillar 111 may be specifically and selectively removed with wet etching.

Figure 64:
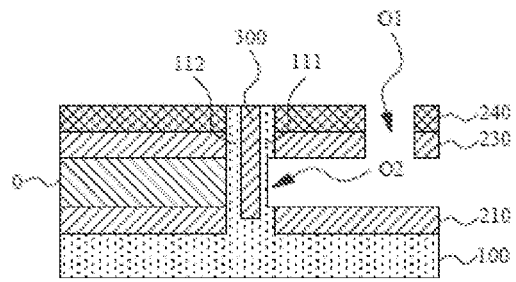
FIGS. 64-66 are stacked structures of a semiconductor structure in various steps in a manufacturing method of a semiconductor structure according to another exemplary implementation.
Figure 65:
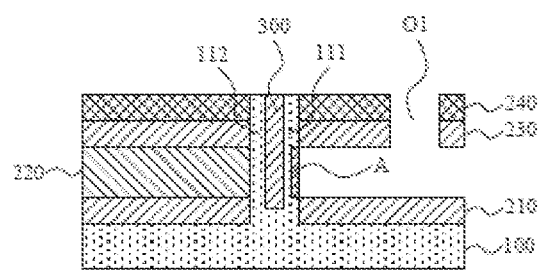
Figure 66:
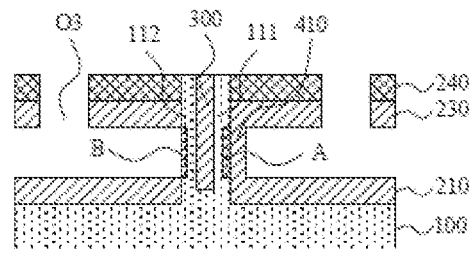

FIGS. 64-66 illustrate stacked structures of a semiconductor structure in various steps in a manufacturing method of a semiconductor structure according to another exemplary implementation.

As shown in FIG. 64 and FIG. 65, in another implementation of the present disclosure, after the sidewall of the first half pillar 111 away from the first trench G1 is exposed in Step S6, a part of the first half pillar 111 may be selectively removed to form a first gap O2 in the sidewall of the first half pillar 111 away from the first trench G1. The first gap O2 may not extend through the first half pillar 111 in the second direction Y. That is, the first gap O2 is formed in the first half pillar 111 in a structure similar to a "recess", rather than a structure similar to a "through recess" in the implementation shown in FIG. 19.

Figure 20:
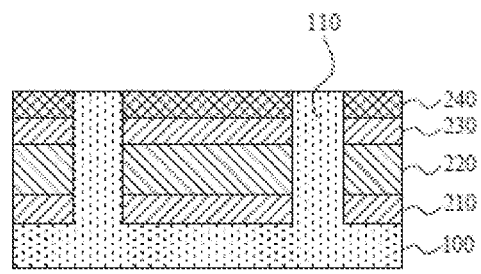
Figure 21:
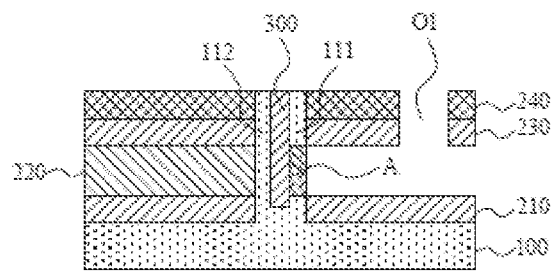

FIG. 20 and FIG. 21 representatively illustrate sectional views of a semiconductor structure from different perspectives in a sub-step of Step S6. In the sub-step, the semiconductor structure includes a substrate 100, a thin-film stacked structure 200, a first half pillar 111, a second half pillar 112, a first isolation layer 300 and a first channel region A. The first channel region A of the first doping type is formed at the first gap O2 in the sub-step.

In an implementation of the present disclosure, in the sub-step, the first channel region A may be formed with the selective epitaxial growth method and the in-situ doping method.

FIG. 22 and FIG. 23 representatively illustrate sectional views of a semiconductor structure from different perspectives in a sub-step of Step S7. In the sub-step, the semiconductor structure includes a substrate 100, a thin-film stacked structure 200, a first half pillar 111, a second half pillar 112, a first isolation layer 300, a first channel region A and a first gate dielectric layer 410. In the sub-step, the first gate dielectric layer 410 is formed on a sidewall of the first channel region A to cover the surface of the first channel region A.

In an implementation of the present disclosure, a material of the first gate dielectric layer 410 may include silicon oxide. In some implementations, the material of the first gate dielectric layer 410 may also include other materials, such as other oxides, but is not limited thereto.

FIG. 24 and FIG. 25 representatively illustrate sectional views of a semiconductor structure from different perspectives in a sub-step of Step S6. In the sub-step, the semiconductor structure includes a substrate 100, a thin-film stacked structure 200, a first half pillar 111, a second half pillar 112, a first isolation layer 300 and a third photoresist layer PR3. The third photoresist layer PR3 is covered on the upper surface of the thin-film stacked structure 200 (namely the upper surface of the mask covering layer 240), the upper surfaces of the first half pillar 111 and the second half pillar 112, and the upper surface of the first isolation layer 300. The third photoresist layer PR2 is patterned to form a photoresist opening. A part of the thin-film stacked structure 200 not shielded by the third photoresist layer PR3 is etched and removed with the photoresist opening of the third photoresist layer PR3 until the upper surface of the first insulating layer 210 is exposed, thereby forming a second opening O3 in the thin-film stacked structure 200.

In addition, after the second opening O3 is formed, the remaining third photoresist layer PR3 is removed.

FIG. 26 and FIG. 27 representatively illustrate sectional views of a semiconductor structure from different perspectives in a sub-step of Step S6. In the sub-step, the semiconductor structure includes a substrate 100, a thin-film stacked structure 200, a first half pillar 111, a second half pillar 112 and a first isolation layer 300. In the sub-step, the sacrificial layer 220 at a side of the first isolation layer 300 close to the second opening O3 is removed along the second opening O3, to expose the sidewall of the second half pillar 112 away from the first trench G1. Thus, the sacrificial layer 220 at two sides of the first isolation layer 300 is completely removed.

In an implementation of the present disclosure, in the sub-step, the part of the sacrificial layer 220 may be specifically removed with wet etching.

Figure 28:
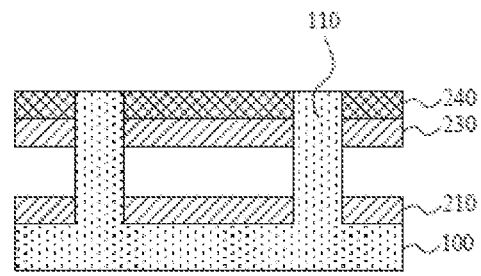
Figure 29:
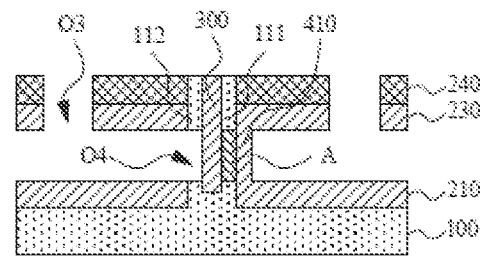

FIG. 28 and FIG. 29 representatively illustrate sectional views of a semiconductor structure from different perspectives in a sub-step of Step S6. In the sub-step, the semiconductor structure includes a substrate 100, a thin-film stacked structure 200, a first half pillar 111, a second half pillar 112 and a first isolation layer 300. In the sub-step, after the sidewall of the second half pillar 112 away from the first trench G1 is exposed, a part of the second half pillar 112 is selectively removed to form a second gap O4 in the sidewall of the second half pillar 112 away from the first trench G1.

In an implementation of the present disclosure, in the sub-step, the second half pillar 112 may be specifically and selectively removed with wet etching.

FIG. 66 illustrates a stacked structure of a semiconductor structure in a step in a manufacturing method of a semiconductor structure according to another exemplary implementation.

As shown in FIG. 66, in another implementation of the present disclosure, after the sidewall of the second half pillar 112 away from the first trench G1 is exposed in Step S6, a part of the second half pillar 112 may be selectively removed to form a second gap O4 in the sidewall of the second half pillar 112 away from the first trench G1. The second gap O4 may not extend through the second half pillar 112 in the second direction Y. That is, the second gap O4 is formed in the second half pillar 112 in a structure similar to a "recess", rather than a structure similar to a "through recess" in the implementation shown in FIG. 29.

Figure 30:
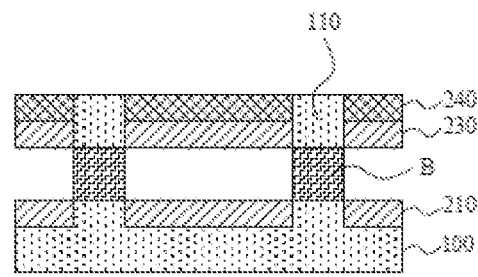
Figure 31:
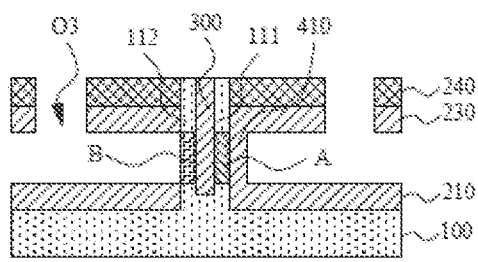

FIG. 30 and FIG. 31 representatively illustrate sectional views of a semiconductor structure from different perspectives in a sub-step of Step S6. In the sub-step, the semiconductor structure includes a substrate 100, a thin-film stacked structure 200, a first half pillar 111, a second half pillar 112, a first isolation layer 300, a first channel region A and a second channel region B. The second channel region B of the second doping type is formed at the second gap O4 in the sub-step.

In an implementation of the present disclosure, in the sub-step, the second channel region B may be formed with the selective epitaxial growth method and the in-situ doping method.

FIG. 32 and FIG. 33 representatively illustrate sectional views of a semiconductor structure from different perspectives in a sub-step of Step S7. In the sub-step, the semiconductor structure includes a substrate 100, a thin-film stacked structure 200, a first half pillar 111, a second half pillar 112, a first isolation layer 300, a first channel region A, a second channel region B, a first gate dielectric layer 410 and a second gate dielectric layer 420. In the sub-step, the second gate dielectric layer 420 is formed on a sidewall of the second channel region B to cover the surface of the second channel region B.

In an implementation of the present disclosure, a material of the second gate dielectric layer 420 may include silicon oxide. In some implementations, the material of the second gate dielectric layer 420 may also include other materials, such as other oxides, but is not limited thereto. In addition, the material of the second gate dielectric layer 420 may be the same as the material of the first gate dielectric layer 410, but is not limited thereto.

FIG. 34 and FIG. 35 representatively illustrate sectional views of a semiconductor structure from different perspectives in a sub-step of Step S7. In the sub-step, the semiconductor structure includes a substrate 100, a thin-film stacked structure 200, a first half pillar 111, a second half pillar 112, a first isolation layer 300, a first channel region A, a second channel region B, a first gate dielectric layer 410, a second gate dielectric layer 420 and a gate conductive layer 430. In the sub-step, after the second gate dielectric layer 420 is formed on the sidewall of the second channel region B to cover the surface of the second channel region B, the gate conductive layer 430 is filled to positions where the sacrificial layer 220 is removed, along the first opening O1 and the second opening O3. The gate conductive layer 430 covers the first gate dielectric layer 410 and the second gate dielectric layer 420.

In an implementation of the present disclosure, a material of the gate conductive layer 430 may include tungsten (W).

Figure 36:
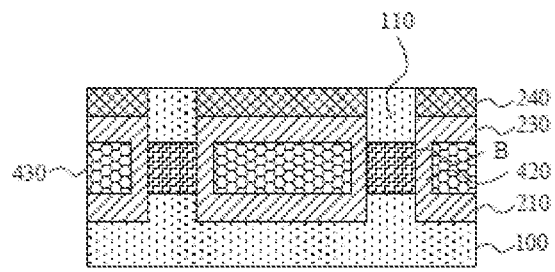
Figure 37:
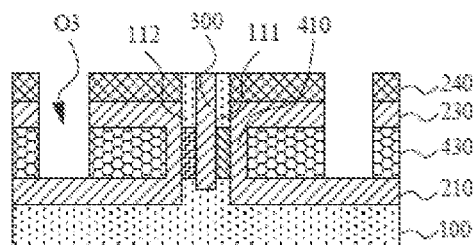

FIG. 36 and FIG. 37 representatively illustrate sectional views of a semiconductor structure from different perspectives in another step. In the step, on the basis of the semiconductor structure in Step S7, a part of the gate conductive layer 430 filled in each of the first opening O1 and the second opening O3 is removed, and a part of the upper surface of the first insulating layer 210 corresponding to each of the first opening O1 and the second opening O3 is exposed.

Figure 38:
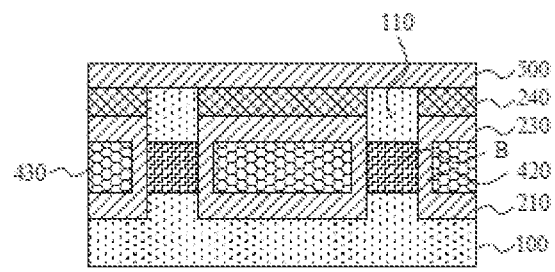
Figure 39:
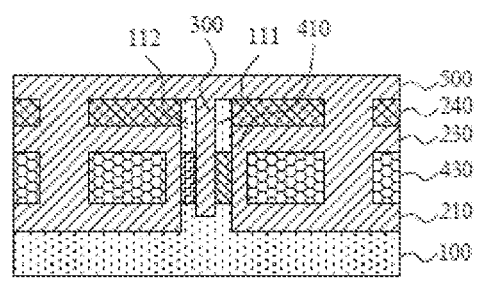

FIG. 38 and FIG. 39 representatively illustrate sectional views of a semiconductor structure from different perspectives in another step. In the step, after the part of the gate conductive layer 430 is removed, a third insulating layer 500 is covered on the upper surface of the thin-film stacked structure 200, the upper surfaces of the first half pillar 111 and the second half pillar 112, and the upper surface of the first isolation layer 300. Meanwhile, the third insulating layer 500 fills the first opening O1 and the second opening O3 after the part of the gate conductive layer 430 is removed, and the space where a part of the sacrificial layer 220 is originally formed.

In an implementation of the present disclosure, a material of the third insulating layer 500 may include silicon oxide. In some implementations, the material of the third insulating layer 500 may also include other materials, such as other oxides, but is not limited thereto.

Figure 40:
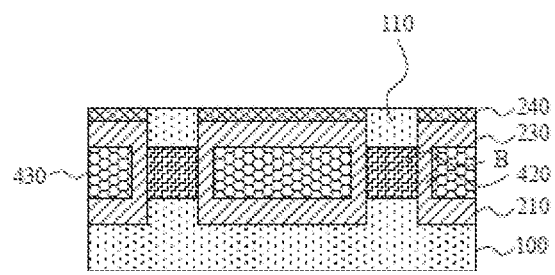
Figure 41:
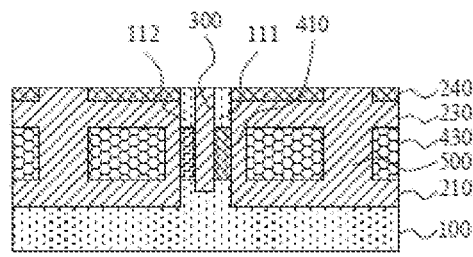

FIG. 40 and FIG. 41 representatively illustrate sectional views of a semiconductor structure from different perspectives in another step. In the step, after the third insulating layer 500 is formed, the third insulating layer 500 on the surface of the thin-film stacked structure 200 is etched back, and a part of the thin-film stacked structure 200 is removed. Specifically, a top part of the mask covering layer 240 is removed, the remaining third insulating layer 500 is located in the first opening O1 and the second opening O3, and the upper surface of the remaining third insulating layer 500 is approximately flush with the upper surface of the remaining mask covering layer 240.

Figure 42:
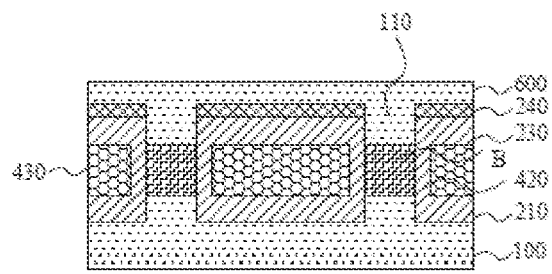
Figure 43:
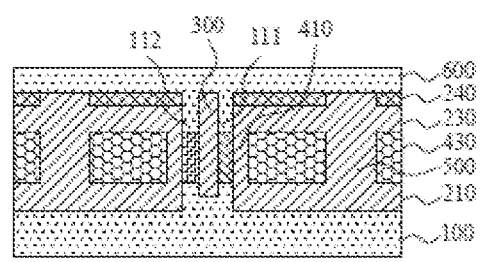

FIG. 42 and FIG. 43 representatively illustrate sectional views of a semiconductor structure from different perspectives in another step. In the step, the semiconductor structure includes a substrate 100, a thin-film stacked structure 200, a first half pillar 111, a second half pillar 112, a first isolation layer 300, a first channel region A, a second channel region B, a gate dielectric layer, a gate conductive layer 430, a third insulating layer 500 and a silicon layer 600. In the step, the silicon layer 600 is covered on the upper surface of the remaining mask covering layer 240 and the upper surface of the remaining third insulating layer 500.

Figure 44:
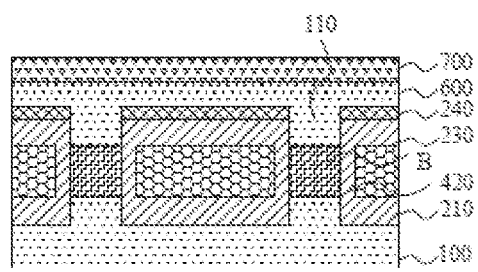
Figure 45:
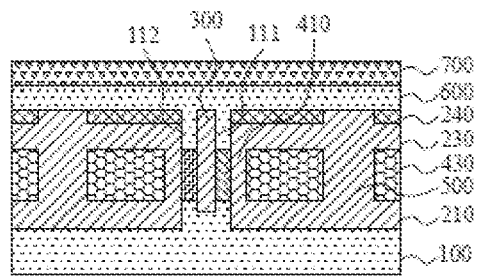

FIG. 44 and FIG. 45 representatively illustrate sectional views of a semiconductor structure from different perspectives in another step. In the step, the semiconductor structure includes a substrate 100, a thin-film stacked structure 200, a first half pillar 111, a second half pillar 112, a first isolation layer 300, a first channel region A, a second channel region B, a gate dielectric layer, a gate conductive layer 430, a third insulating layer 500, a silicon layer 600 and a system on chip (SOC) layer 700. In the step, the SOC layer 700 is covered on an upper surface of the silicon layer 600.

Figure 46:
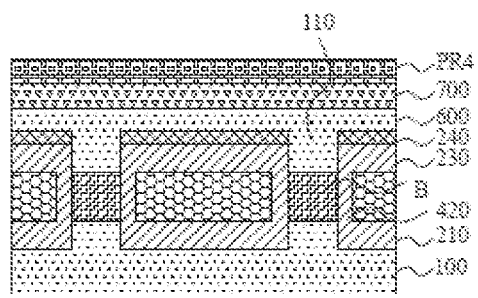
Figure 47:
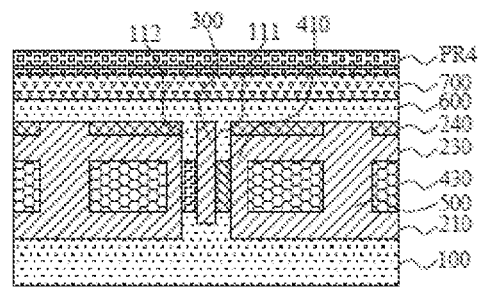

FIG. 46 and FIG. 47 representatively illustrate sectional views of a semiconductor structure from different perspectives in another step. In the step, the semiconductor structure includes a substrate 100, a thin-film stacked structure 200, a first half pillar 111, a second half pillar 112, a first isolation layer 300, a first channel region A, a second channel region B, a gate dielectric layer, a gate conductive layer 430, a third insulating layer 500, a silicon layer 600, an SOC layer 700 and a fourth photoresist layer PR4. In the step, the fourth photoresist layer PR4 is covered on an upper surface of the SOC layer 700.

Figure 48:
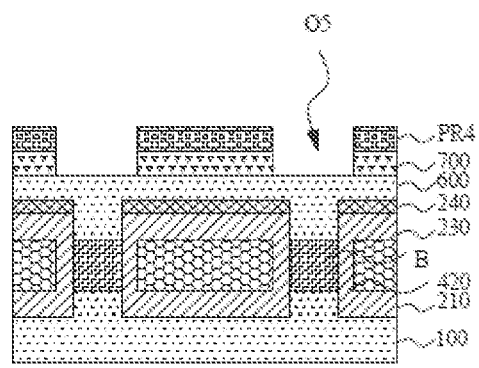
Figure 49:
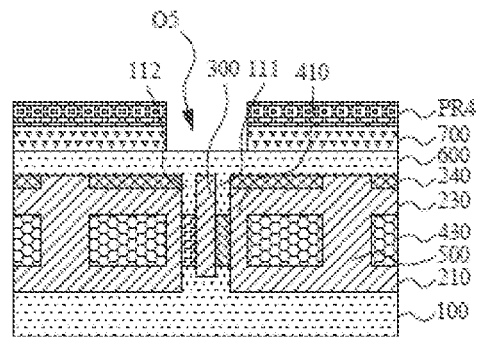

FIG. 48 and FIG. 49 representatively illustrate sectional views of a semiconductor structure from different perspectives in another step. In the sub-step, after the fourth photoresist layer PR4 is covered, the fourth photoresist layer PR4 is patterned to form a photoresist opening. A part of the SOC layer 700 not shielded by the fourth photoresist layer PR4 is etched and removed with the photoresist opening of the fourth photoresist layer PR4 until the upper surface of the silicon layer 600 is exposed, thereby forming a third opening O5 in the silicon layer 600.

In addition, after the third opening O5 is formed, the remaining fourth photoresist layer PR4 is removed.

Figure 50:
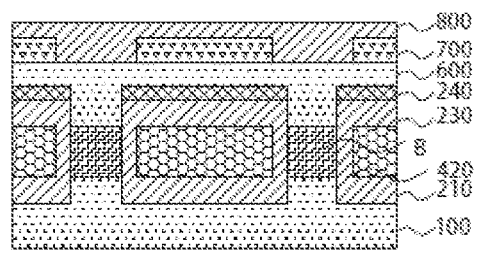
Figure 51:
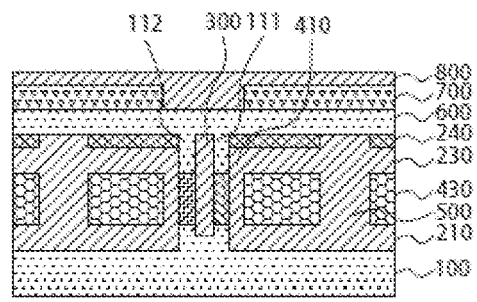

FIG. 50 and FIG. 51 representatively illustrate sectional views of a semiconductor structure from different perspectives in another step. In the step, the semiconductor structure includes a substrate 100, a thin-film stacked structure 200, a first half pillar 111, a second half pillar 112, a first isolation layer 300, a first channel region A, a second channel region B, a gate dielectric layer, a gate conductive layer 430, a third insulating layer 500, a silicon layer 600, an SOC layer 700 and a patterned mask layer 800. In the step, the patterned mask layer 800 is covered on an upper surface of the SOC layer 700 and an upper surface of the silicon layer 600 exposed in the third opening O5, and the patterned mask layer 800 fills the third opening O5.

Figure 52:
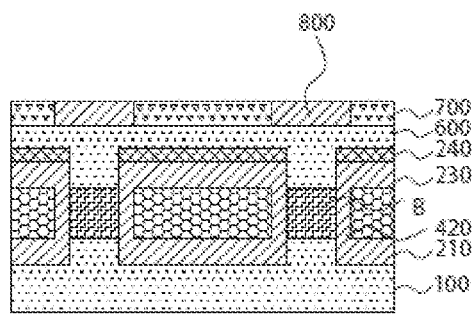
Figure 53:
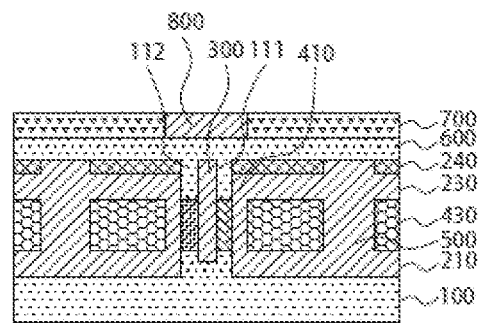

FIG. 52 and FIG. 53 representatively illustrate sectional views of a semiconductor structure from different perspectives in another step. In the step, after the patterned mask layer 800 is covered, the patterned mask layer 800 on the upper surface of the SOC layer 700 is removed, and the remaining patterned mask layer 800 fills the third opening O5. In addition, the upper surface of the remaining patterned mask layer 800 may be approximately flush with the upper surface of the SOC layer 700, or slightly higher than the upper surface of the SOC layer 700.

Figure 54:
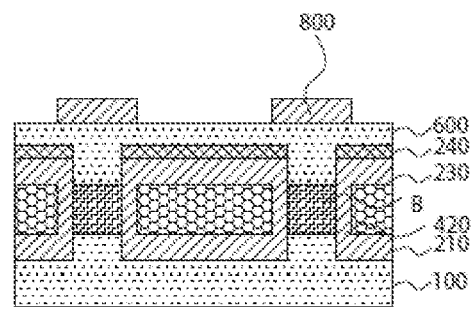
Figure 55:
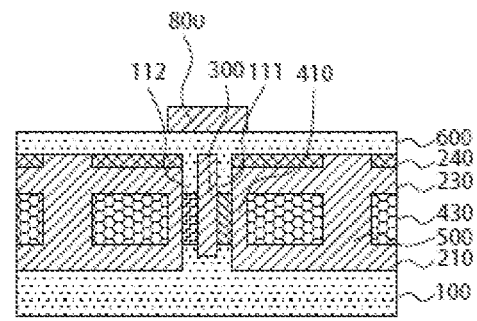

FIG. 54 and FIG. 55 representatively illustrate sectional views of a semiconductor structure from different perspectives in another step. In the step, after the patterned mask layer 800 on the upper surface of the SOC layer 700 is removed, the remaining SOC layer 700 is removed, and the remaining patterned mask layer 800 is retained.

Figure 56:
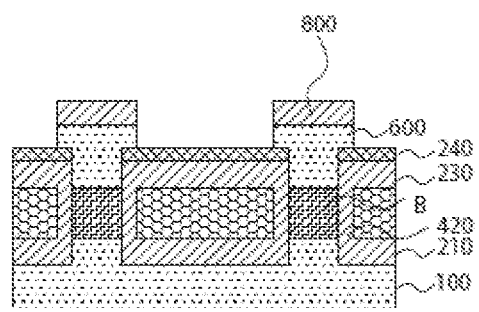
Figure 57:
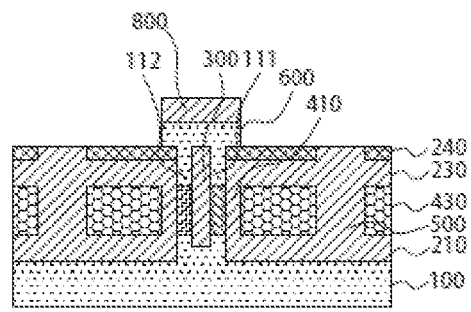

FIG. 56 and FIG. 57 representatively illustrate sectional views of a semiconductor structure from different perspectives in another step. In the step, after the remaining SOC layer 700 is removed, the silicon layer 600 not shielded by the patterned mask layer 800 is etched with the remaining patterned mask layer 800 as a mask until the upper surface of the mask covering layer 240 is exposed. Thus, the remaining silicon layer 600 defines one end of a source/drain, and the epitaxial silicon pillar 110 below the first channel region A and the second channel region B serves as the other end of the source/drain.

Figure 58:
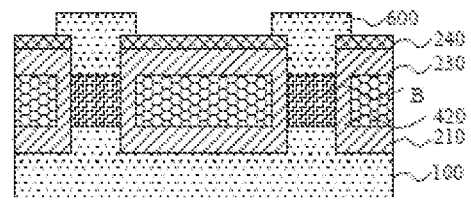
Figure 59:
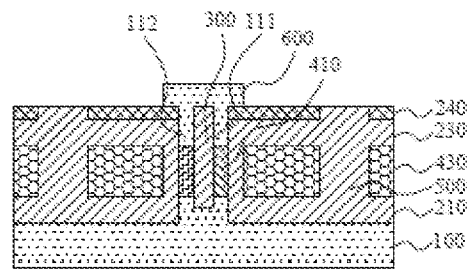

FIG. 58 and FIG. 59 representatively illustrate sectional views of a semiconductor structure from different perspectives in another step. In the step, after one end of the source/drain is defined, the remaining patterned mask layer 800 is removed.

Figure 60:
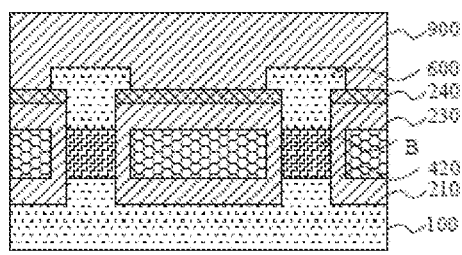
Figure 61:
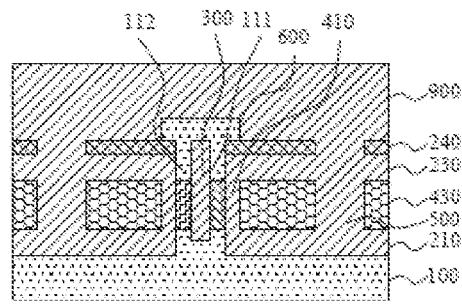

FIG. 60 and FIG. 61 representatively illustrate sectional views of a semiconductor structure from different perspectives in another step. In the step, the semiconductor structure includes a substrate 100, a thin-film stacked structure 200, a first half pillar 111, a second half pillar 112, a first isolation layer 300, a first channel region A, a second channel region B, a gate dielectric layer, a gate conductive layer 430, a third insulating layer 500, a silicon layer 600 and a fourth insulating layer 900. The fourth insulating layer 900 is covered on the upper surface of the remaining mask covering layer 240, the upper surface of the third insulating layer 500 and the upper surface of the remaining silicon layer 600.

In an implementation of the present disclosure, a material of the fourth insulating layer 900 may include silicon oxide. In some implementations, the material of the fourth insulating layer 900 may also include other materials, such as other oxides, but is not limited thereto.

FIG. 62 and FIG. 63 representatively illustrate sectional views of a semiconductor structure from different perspectives in another step. In the step, after the fourth insulating layer 900 is covered, a part of the fourth insulating layer 900 is removed to expose the upper surface of the remaining silicon layer 600 (namely one end of the source/drain).

It should be noted here that the manufacturing method of a semiconductor structure shown in the drawings and described in the specification only show a few examples of the many methods that may adopt the principles of the present disclosure. It should be clearly understood that the principle of the present disclosure is by no means limited to any details or any steps of the manufacturing method of a semiconductor structure shown in the drawings or described in this specification.

Based on the above detailed description on the exemplary implementations of the manufacturing method of a semiconductor structure proposed by the present disclosure, an exemplary embodiment of the semiconductor structure proposed by the present disclosure will be described below.

As shown in FIG. 62 and FIG. 63, in an implementation of the present disclosure, a semiconductor structure includes a substrate 100, a thin-film stacked structure 200, an epitaxial silicon pillar 110 and a first isolation layer 300. Specifically, the thin-film stacked structure 200 is provided on a surface of the substrate 100. A first hole V1 exposing the substrate 100 is formed in the thin-film stacked structure 200. The epitaxial silicon pillar 110 is provided in the first hole V1. The first isolation layer 300 is provided in a first trench G1. The first isolation layer 300 fills the first trench G1. The first trench G1 is formed by removing a part of the thin-film stacked structure 200 and a part of the epitaxial silicon pillar 110 along a first direction X. The first trench G1 passes through a center of the epitaxial silicon pillar 110 and divides the epitaxial silicon pillar 110 into a first half pillar 111 and a second half pillar 112. A first channel region A of a first doping type is formed in a sidewall of the first half pillar 111 away from the first trench G1. A second channel region B of a second doping type is formed in a sidewall of the second half pillar 112 away from the first trench G1. One of the first doping type and the second doping type is an N type, and the other one is a P type. A gate dielectric layer and a gate conductive layer 430 are arranged on a surface of each of the first channel region A and the second channel region B.

In an implementation of the present disclosure, the gate dielectric layer includes a first gate dielectric layer 410 and a second gate dielectric layer 420. The gate conductive layer 430 includes a first gate conductive layer and a second gate conductive layer. The first gate dielectric layer 410 and the first gate conductive layer are located at a side of the first channel region A away from the first trench G1. The second gate dielectric layer 420 and the second gate conductive layer are located at a side of the second channel region B away from the first trench G1. The first gate conductive layer and the second gate conductive layer are isolated from each other.

It should be noted here that the semiconductor structure shown in the drawings and described in the specification only show a few examples of the many semiconductor structures that may adopt the principles of the present disclosure. It should be clearly understood that the principle of the present disclosure is by no means limited to any details or any components of the semiconductor structure shown in the drawings or described in the specification.

To sum up, a first hole V1 exposing a substrate 100 is formed in a thin-film stacked structure 200, an epitaxial silicon pillar 110 is grown in the first hole V1, a first trench G1 is formed along a first direction X, and the first trench G1 passes through a center of the epitaxial silicon pillar 110 and divides the epitaxial silicon pillar into a first half pillar 111 and a second half pillar 112. Upon this, a first channel region A of a first doping type is formed in a sidewall of the first half pillar 111 away from the first trench G1, a second channel region B of a second doping type is formed in a sidewall of the second half pillar 112 away from the first trench G1, and a gate dielectric layer and a gate conductive layer 430 are arranged on a surface of each of the first channel region A and the second channel region B. With the above design, the manufacturing method of a semiconductor structure according to the present disclosure can specifically manufacture the 3D NOP capacitor-less DRAM device. Because of no capacitor structure in the semiconductor structure manufactured with the method, the process is simpler and easier to realize a higher memory density, which fills the technical gap of the 3D NOP capacitor-less DRAM device in the industry.

The present disclosure is described above with reference to several typical implementations. It should be understood that the terms used herein are intended for illustration, rather than limiting. The present disclosure may be specifically implemented in many forms without departing from the spirit or essence of the present disclosure. Therefore, it should be understood that the above embodiments are not limited to any of the above-mentioned details, but should be broadly interpreted according to the spirit and scope defined by the appended claims. Therefore, any changes and modifications falling within the claims or the equivalent scope thereof should be covered by the appended claims.

The invention claimed is:

1. A manufacturing method of a semiconductor structure, comprising:

providing a substrate, and depositing a thin-film stacked structure on the substrate;

forming a first hole in the thin-film stacked structure, the first hole extending through the thin-film stacked structure along a stacking direction of the thin-film stacked structure, and a bottom of the first hole exposing the substrate;

growing an epitaxial silicon pillar in the first hole;

etching the thin-film stacked structure and the epitaxial silicon pillar along a first direction to form a first trench, the first trench passing through a center of the epitaxial silicon pillar and dividing the epitaxial silicon pillar into a first half pillar and a second half pillar;

forming a first isolation layer, the first isolation layer filling the first trench;

forming a first channel region of a first doping type in a sidewall of the first half pillar away from the first trench, and forming a second channel region of a second doping type in a sidewall of the second half pillar away from the first trench, one of the first doping type and the second doping type being an N type, and the other one being a P type; and forming a gate dielectric layer and a gate conductive layer on a surface of each of the first channel region and the second channel region.

2. The manufacturing method of a semiconductor structure according to claim 1, wherein the forming a first hole in the thin-film stacked structure comprises:

forming, on the thin-film stacked structure, a patterned mask layer with a hole pattern; and etching the thin-film stacked structure along the hole pattern until the substrate is exposed, thereby forming the first hole.

3. The manufacturing method of a semiconductor structure according to claim 2, wherein the growing an epitaxial silicon pillar in the first hole comprises:

growing, in the first hole, the epitaxial silicon pillar with a selective epitaxial growth method from a surface of the substrate exposed by the first hole, until a top surface of the epitaxial silicon pillar is not lower than a top surface of the patterned mask layer.

4. The manufacturing method of a semiconductor structure according to claim 1, wherein a width of the first trench is 30-90% of a maximum width of the epitaxial silicon pillar in a second direction.

5. The manufacturing method of a semiconductor structure according to claim 1, wherein the depositing a thin-film stacked structure on the substrate comprises:

sequentially depositing a first insulating layer, a sacrificial layer, a second insulating layer and a mask covering layer on the substrate, a thickness of the sacrificial layer being 50-90% of a thickness of the thin-film stacked structure.

6. The manufacturing method of a semiconductor structure according to claim 5, after the forming a first isolation layer, further comprising: forming a first opening in the thin-film stacked structure at a first side of the first isolation layer, the first opening exposing at least a part of the sacrificial layer.

7. The manufacturing method of a semiconductor structure according to claim 6, after the forming a first opening, further comprising:

removing, with wet etching along the first opening, the sacrificial layer at a side of the first isolation layer close to the first opening, to expose the sidewall of the first half pillar away from the first trench.

8. The manufacturing method of a semiconductor structure according to claim 7, wherein the forming a first channel region of a first doping type in a sidewall of the first half pillar away from the first trench comprises:

selectively removing, after the exposing the sidewall of the first half pillar away from the first trench, a part of the first half pillar with wet etching, to form a first gap in the sidewall of the first half pillar away from the first trench; and forming the first channel region of the first doping type at the first gap with a selective epitaxial growth method and an in-situ doping method.

9. The manufacturing method of a semiconductor structure according to claim 8, wherein the gate dielectric layer comprises a first gate dielectric layer and a second gate dielectric layer, and the forming a gate dielectric layer and a gate conductive layer on a surface of each of the first channel region and the second channel region comprises:

forming the first gate dielectric layer on a sidewall of the first channel region to cover the surface of the first channel region.

10. The manufacturing method of a semiconductor structure according to claim 9, after the forming the first gate dielectric layer on a sidewall of the first channel region to cover the surface of the first channel region, further comprising: forming a second opening in the thin-film stacked structure at a second side of the first isolation layer, the second opening exposing at least a part of the sacrificial layer.

11. The manufacturing method of a semiconductor structure according to claim 10, after the forming a second opening, further comprising:

removing, with wet etching along the second opening, the sacrificial layer at a side of the first isolation layer close to the second opening, to expose the sidewall of the second half pillar away from the first trench.

12. The manufacturing method of a semiconductor structure according to claim 11, wherein the forming a second channel region of a second doping type in a sidewall of the second half pillar away from the first trench comprises:

selectively removing, after the exposing the sidewall of the second half pillar away from the first trench, a part of the second half pillar with wet etching, to form a second gap in the sidewall of the second half pillar away from the first trench; and forming the second channel region of the second doping type at the second gap with the selective epitaxial growth method and the in-situ doping method.

13. The manufacturing method of a semiconductor structure according to claim 12, wherein the forming a gate dielectric layer and a gate conductive layer on a surface of each of the first channel region and the second channel region comprises:

forming the second gate dielectric layer on a sidewall of the second channel region to cover the surface of the second channel region.

14. The manufacturing method of a semiconductor structure according to claim 13, wherein the forming a gate dielectric layer and a gate conductive layer on a surface of each of the first channel region and the second channel region comprises:

filling, after the forming the second gate dielectric layer on a sidewall of the second channel region to cover the surface of the second channel region, the gate conductive layer to positions where the sacrificial layer is removed, along the first opening and the second opening, wherein the gate conductive layer covers the first gate dielectric layer and the second gate dielectric layer.

15. The manufacturing method of a semiconductor structure according to claim 14, after the forming the gate conductive layer, further comprising:

forming a second trench in a side of the first trench close to the first opening, and forming a third trench in a side of the first trench close to the second opening, the second trench and the third trench being parallel to the first trench and extending toward the first direction, and a bottom of each of the second trench and the third trench exposing the first insulating layer to separate the gate conductive layer; taking a part of the gate conductive layer close to the first channel region as a first gate electrode, and taking a part of the gate conductive layer close to the second channel region as a second gate electrode; filling a second isolation layer in the second trench, and filling a third isolation layer in the third trench.

16. A semiconductor structure, comprising a substrate, a thin-film stacked structure, an epitaxial silicon pillar and a first isolation layer, wherein the thin-film stacked structure is provided on a surface of the substrate; a first hole exposing the substrate is formed in the thin-film stacked structure; the epitaxial silicon pillar is provided in the first hole; the first isolation layer is provided in a first trench; the first trench is formed by removing a part of the thin-film stacked structure and a part of the epitaxial silicon pillar along a first direction; the first trench passes through a center of the epitaxial silicon pillar and divides the epitaxial silicon pillar into a first half pillar and a second half pillar; a first channel region of a first doping type is formed in a sidewall of the first half pillar away from the first trench; a second channel region of a second doping type is formed in a sidewall of the second half pillar away from the first trench; one of the first doping type and the second doping type is an N type, and the other one is a P type; and a gate dielectric layer and a gate conductive layer are arranged on a surface of each of the first channel region and the second channel region.

17. The semiconductor structure according to claim 16, wherein the gate dielectric layer comprises a first gate dielectric layer and a second gate dielectric layer; the gate conductive layer comprises a first gate conductive layer and a second gate conductive layer; the first gate dielectric layer and the first gate conductive layer are located at a side of the first channel region away from the first trench; the second gate dielectric layer and the second gate conductive layer are located at a side of the second channel region away from the first trench; and the first gate conductive layer and the second gate conductive layer are isolated from each other.

* * * * *